(12) United States Patent
Daly et al.

(10) Patent No.: US 9,875,078 B1
(45) Date of Patent: Jan. 23, 2018

(54) EXTERNAL AMPLIFIER INTERFACE

(71) Applicants: Charles David Daly, Holly Hill, FL (US); William H. Jones, Holly Hill, FL (US)

(72) Inventors: Charles David Daly, Holly Hill, FL (US); William H. Jones, Holly Hill, FL (US)

(73) Assignee: Metra Electronics Corporation, Holly Hill, FL (US)

(*) Notice: Subject to any disclaimer, the term of this patent is extended or adjusted under 35 U.S.C. 154(b) by 0 days.

(21) Appl. No.: 15/371,463

(22) Filed: Dec. 7, 2016

(51) Int. Cl.
| | |
|---|---|
| *H04R 5/00* | (2006.01) |
| *G06F 3/16* | (2006.01) |
| *G06F 13/42* | (2006.01) |
| *G06F 9/54* | (2006.01) |
| *H03G 5/02* | (2006.01) |
| *G06F 3/0484* | (2013.01) |
| *H03G 3/10* | (2006.01) |
| *H04L 12/40* | (2006.01) |
| *H04W 4/00* | (2009.01) |

(52) U.S. Cl.
CPC .......... *G06F 3/165* (2013.01); *G06F 3/04847* (2013.01); *G06F 9/54* (2013.01); *G06F 13/42* (2013.01); *H03G 3/10* (2013.01); *H03G 5/025* (2013.01); *H04L 2012/40215* (2013.01); *H04W 4/008* (2013.01)

(58) Field of Classification Search
CPC ........... H04L 2012/40215; G06F 3/165; G06F 3/04847; G06F 9/54; G06F 13/42; H03G 3/10; H03G 5/025; H04W 4/008
USPC ..................................................... 381/28, 86
See application file for complete search history.

(56) References Cited

U.S. PATENT DOCUMENTS

2017/0064445 A1* 3/2017 Pierfelice ............... H03G 5/165

* cited by examiner

*Primary Examiner* — Paul S Kim
(74) *Attorney, Agent, or Firm* — J. Wiley Horton

(57) ABSTRACT

An interface configured to allow desired cooperation between an OEM or aftermarket head unit and an external power amplifier. The inventive interface receives an audio input signal from the head unit. It also monitors the vehicle's CAN bus. The interface detects CAN bus commands that cause the head unit to play an audio notification signal such as a "chime." Upon detecting such a CAN bus command, the inventive interface selectively adjusts the output level so that the user hears the audio notification signal at an appropriate volume.

20 Claims, 12 Drawing Sheets

EXTERNAL AMPLIFIER INTERFACE

FIELD OF THE INVENTION

This invention relates to the field of motor vehicle entertainment and warning systems. More specifically, the invention comprises an interface module configured to permit an external audio amplifier to be used with an existing head unit.

DESCRIPTION OF RELATED ART

The present invention is an interface module designed to facilitate the use of an external audio amplifier with either an OEM or aftermarket stereo head unit. The term "stereo head unit" is familiar to those skilled in the art. The term traditionally referred to a vehicle's radio, with possibly an incorporated tape or CD player. In recent years the functionality of both originally installed ("OEM") and replacement ("aftermarket") head units has expanded dramatically. Head units may now include a large display that selectively displays navigation functions, reverse cameras, and detailed "touch screen" menus.

Many head units now display functions unrelated to traditional entertainment features. As an example, some manufacturers now include the climate control functions in the head unit. A touch screen is provided to the user. In some modes this touch screen displays radio functions—such as station selection buttons. In a second mode, the same display presents climate control features, such as a desired temperature and fan speed. Such head units are integrated into many vehicle systems and this presents a challenge for a user wishing to upgrade the audio performance in his or her vehicle.

OEM head units typically present two or four channel outputs, with each channel being limited to 22 Watts. The speakers provided in the vehicle are low-cost units employing paper transducer cones. This type of speaker is limited to relatively low sound levels. A user wishing to upgrade the system will often replace the speakers with non-paper units capable of much higher sound levels. The traditional solution has been to add an external power amplifier between the head unit and the new speakers. This allows the maximum 22 W output from the OEM head unit to be increased significantly.

The traditional solution of adding an external power amplifier is no longer a simple proposition, however, because the head units are now integral to so many different vehicle systems. In order for the reader to understand why, it is important to understand how present vehicle electronic components communicate. FIGS. 1 through 5 provide a top-level explanation of this background information.

Motor vehicles have traditionally used directly-connected low voltage circuitry for both control and power systems. A simple example is a power window. A power window circuit used in employ a 12V motor with its own distribution circuit and a switch wired in series with the motor. The switch was normally open. It also had two closed positions. The first position actuated the motor in a first direction and the second position actuated the motor in the opposite direction. This type of circuit is no longer used. Instead, communications between vehicle components now assume a digital form over a Controller Area Network, which is commonly referred to as a "CAN bus."

FIG. 1 illustrates a common form of CAN bus. CAN bus 10 is created using two conductor—CAN HI conductor 14 and CAN LO conductor 16. The two free ends are joined by a terminator resistor 12. The two conductors are run as a twisted pair to reduce unwanted emissions. Many different devices are tied to this CAN bus. These are shown as nodes 18 (Node 1 through Node n). Some nodes may be complex devices—such as an integrated computer known as a Body Control Unit ("BCU"). Other nodes may be simple devices—such as a window drive motor controller and its associated position sensor.

There are many different standards in use for vehicle CAN buses. However, they all share some common traits. Any message placed on the CAN bus is transmitted to all nodes. Thus, some sort of addressing system is employed to "tell" all the recipients the specific node the message is intended for.

Returning to the example of a power window, those skilled in the art will know that the CAN bus system operates very differently from its hard-wired ancestor (though this is not generally apparent to the user). If a user of a vehicle equipped with a CAN bus wishes to roll down the driver's side window, he or she still presses a switch associated with that function. The switch is not directly connected to the window's regulator motor, however. Instead, it is connected to the CAN bus. The actuation of the switch generates a digital message on the CAN bus. That message includes information indicating that it is (1) intended for the Body Control Unit, (2) originating with a particular device—the window switch, and (3) indicating a user intent to roll down the window.

All the nodes on the CAN bus receive this message, but only the Body Control Unit acts on it. The BCU properly decodes the message and then creates a responsive command that is also placed on the CAN bus. The responsive command is (1) addressed to the driver's side window regulator motor controller, and (2) commands an action ("apply negative voltage to the motor and begin counting revolutions").

The window regulator motor controller associated with the driver's side window regulator motor decodes the BCU message and acts on it. It also responds by placing position status messages on the CAN bus so that the BCU can stop the window's motion at the appropriate point. It is important to note that power to the window regulator motor is not provided by the CAN bus. It is provided through conventional distribution circuits (with fuses and/or breakers). The CAN bus provides control. Separate power circuits provide power. But, the power circuits do not have to be switched (since control is via the CAN bus). This allows the power distribution circuits to be quite simple.

The reader will rapidly appreciate the fact that many CAN bus messages are often present on the bus. The system is a peer-to-peer network, so there is typically nothing providing a prioritization or gate-keeper function. Many CAN bus arrangements include message priority functions and other tools within the nodes themselves. While these features are beyond the scope of this disclosure, suffice it to say that the CAN bus approach is now well evolved and quite reliable.

The depiction of FIG. 1 suggests that the CAN bus includes only a single twisted pair. This would not be very practical. Most vehicles include multiple individual wiring harnesses that are joined by connectors. FIG. 2 shows a representative CAN bus distribution employing multiple individual segments. The different portions of CAN bus 10 are joined by branch/connectors 20. These facilitate routing and connecting the many nodes 18 that communicate via the CAN bus. From an electrical standpoint, however, the CAN bus is still just two conductors with a terminal resistor on each end.

FIG. 3 schematically depicts some of the vehicle components that are typically connected to the CAN bus. The depiction is by no means complete, as modern CAN buses may connect over one hundred individual nodes, but it does provide a representative sample.

Engine Control Unit 22 is connected to the CAN bus and provides a gateway to a separate network. The Engine Control Unit ("ECU") is often the master node on an engine based harness where many sensors produce information. The ECU may feed some of this information (such as coolant temperature and engine speed) onto the CAN bus for use by other modules (such as Dash Control Unit 30). A brief description of the other nodes shown is as follows:

Transmission Control Unit 24—Controls the shifting of an automatic transmission and its torque converter settings. Provides status information back to the CAN bus.

Brake Control Unit 26—Controls brake modulation and ABS functions.

Body Control Unit 28—Controls many functions such as window position, mirror position, seat positions, etc, Dash Control Unit 30—Controls the displays presented on the dash.

Steering Wheel Control Unit 32—Digitizes information from steering wheel buttons and switches and places it on the CAN bus.

HVAC Control Unit 34—Controls the heating and air conditioning functions.

OEM Head Unit 36—Provides entertainment and other functions. This device includes the radio, CD player and typically a large display.

Door switches 38, 40—Indicate whether a door is open or closed by placing an appropriate digital message on the CAN bus.

Front proximity sensor 42—Often now multiple individual ultrasonic sensors that sense proximity to objects.

Right proximity sensor 44—One or more sensors sensing proximity to objects along the vehicle's right side.

Many more sensors and sensing units are now often feeding information to the CAN bus. These include:

(1) Lane sensing units that detect the position of the vehicle with respect to the fog line or lane dividing lines in order to provide an alert signal when the vehicle approaches its lane boundary;

(2) Collision detecting units that monitor relative motion in front of the vehicle and provide alerts (and even automatic braking) if an impending collision is detected.

As those skilled in the art will know, there are many different CAN bus standards in use and they are not generally compatible. Each major manufacturer has developed its own proprietary standard. An interface module such as proposed in the present invention is preferably able to receive CAN bus communications under the most popular standards. In order to do so, it is preferably able to store and receive multiple CAN bus formats.

An inventive interface should also account for the fact that modern head units are integrated with many other vehicle systems. As shown in FIG. 3, OEM head unit 36 is integrated with all these other systems via the CAN bus. This integration provides many advantages, but also introduces a problem relevant to the current invention. The OEM head unit is now used for many purposes beyond providing audio entertainment. Warning "chimes" used to be provided by dedicated sound units that were hard-wired to particular switches (such as "door open" switches). These signals—generically referred to herein as an "audio notification signals"—are now produced by the OEM head unit. As an example, consider the opening of the driver's side door: This causes the door monitoring node to place a "door open" message on the CAN bus (directed to the Body Control Unit). The BCU will then create a message requesting a particular "door open chime" sound that is addressed to the OEM head unit.

The OEM head unit receives this CAN bus message. It then retrieves an appropriate audio file from memory and internally generates the audio signal required to create the chime sound. It amplifies this and plays the sound. It will often also suppress the normal audio signal it is producing so that the chime signal may be more easily heard.

This functionality produces an issue for a user wishing to install an external amplifier. If one simply connects an external amplifier to the OEM head unit, then the audio notification signals produced by the head unit may be amplified to a very high level. The user finds this jarring. The reader will recall that the vehicle's original audio output is typically something like 22 W per channel. The volume of the audio notification signal is scaled to this 22 W level. However, an external amplifier may boost the output level by an order of magnitude (200+ Watts). An audio notification signal at this level may be deafening.

And, the reader should bear in mind that modern Body Control Units may produce warning sounds every time a vehicle wanders near the edge of its lane. A warning sound may be produced about once per minute. All of these sounds will be amplified by the external amplifier to an unwanted degree. Thus, this issue is not on occasional thing.

In order to understand how the present invention addresses these problems, it is helpful for the reader to have an additional understanding of how existing head units function. FIGS. 4 and 5 provide examples of existing head units and how they are connected. The example of FIG. 4 is a common installation in modern vehicles. The wiring and external connections are shown as simplified representations. For example, those skilled in the art will know that each speaker connection is made by a pair of wires. However, for purposes of visual simplicity, only a single line is shown for each speaker connection in FIG. 4. The same can be said of CAN bus input 56.

The OEM head unit typically includes CAN bus input 56, antenna input 41, and power input 39. Output lines 54 facilitate connection to right-front speaker 43, left-front speaker 45, right-rear speaker 46, and left-rear speaker 48. The audio signals that are amplified and sent to the speakers originate within the OEM head unit. These may come from an external source (such as the radio receiver) or an internal source (such as reading a CD). As explained previously, the OEM head unit is also used to play various chimes and warning tones (audio notification signals). These chimes and tones are typically stored within the head unit itself. The Body Control Unit may command the playing of a chime. This command comes into the head unit over CAN bus input 56 as a digital sequence. It does not typically include an audio file. Rather, it is an instruction commanding the OEM head unit to retrieve an appropriate audio file from its own internal memory and then amplify that audio file and send it to the speakers.

The configuration shown in FIG. 4 is typical of relatively low power OEM systems (such as a 4 channel system with 22 W per channel). The signal placed on the head unit output lines may include characteristics that are undesirable for the use of an external amplifier. A good example is the equalization typically used in an OEM head unit. The vehicle manufacturer specifies output frequency characteristics that are suitable for the speakers in use. Paper cone speakers can handle relatively high wattage in the mid and high range frequencies. However, bass frequencies will tend to overdrive such speakers and produce unwanted distortion. In order to address this problem, OEM head units often include an internal equalizer that attenuates the low frequencies compared to the rest of the spectrum. If this output is simply connected to an external amplifier, the attenuated lower frequencies will remain (even though the aftermarket amplifier and speakers could easily handle a higher level in the bass range).

And—to further complicate matters—the frequency attenuation is often no constant. Many OEM head units only chop the bass frequencies if the overall output level exceeds a threshold. Some OEM units even apply a progressive attenuation depending on the output level.

Some OEM systems actually do include an external amplifier, particularly where a higher output level is needed. FIG. 5 shows an exemplary prior art system in which an external amplifier is used. OEM head unit produces 4 separate output channel signals denoted as head unit output lines 54. These lines feed into OEM amplifier 58. OEM amplifier has its own separate power input 39. It produces five output signals—four for the primary speakers and one additional output for subwoofer 50.

In many prior art installations the signals leaving the OEM head unit are actually "power" signals—meaning that they have sufficient amplitude to drive the speakers without further amplification. OEM amplifier 58 further boosts these signals. The OEM amplifier is typically controlled by the OEM head unit. A "line out controller" within the OEM head unit produces a control signal for the OEM amplifier. Line out controller feed 52 carries these control signals from the head unit to the amplifier. The line out controller typically produces a digital signal that is carried over a dedicated bus.

OEM amplifier 58 may be configured to both amplify and attenuate the signals on head unit output lines 54. In other words, line out controller may "chop" the signal coming from the OEM head unit as well as boosting it. The OEM amplifier may be remotely located—such as in the vehicle's trunk. In this case it is helpful to use a power level signal on head unit output lines 54 in order to maintain a sufficiently high signal-to-noise ratio for the long cable run needed. A minimum signal level may be specified for head unit output lines 54. If a lower final output is needed the line out controller within the OEM amplifier may actually command OEM amplifier 58 to attenuate the signal.

One example where such an attenuation may be needed is where a warning chime is to be played. It is desirable for a warning chime to be easily heard over the music being played. One could accomplish this goal by making the warning chime extremely loud, but this would startle the user. Instead, it is preferable to reduce the volume level of the music and sound the warning chime at a normal level. In an OEM installation such as in FIG. 5, the OEM head unit may command the amplifier to chop the output by 50% while playing the warning chime at a level that is louder than the music being played.

In the scenarios of FIGS. 4 and 5, a user will often wish to use an aftermarket amplifier and aftermarket speakers. The aftermarket products offer superior performance and many users desire to have this performance. However, the OEM head unit is now so integrated into many different vehicle systems that the user may choose to keep it in place. It is also possible to replace the OEM head unit with an aftermarket head unit providing many of the same functions. Whichever head unit is employed, however, the user will often want to add an aftermarket external power amplifier.

As explained previously, simply adding an external amplifier to the head unit output lines may produce unwanted results. A good example is that warning chimes and the like will be played at an uncomfortably loud level. Another example is the fact that bass attenuation designed into the OEM head unit persists in the amplified signal. What is needed is an interface unit that connects the head unit to an external amplifier while solving these problems. The present invention provides such a solution.

BRIEF SUMMARY OF THE PRESENT INVENTION

The present invention comprises an interface configured to allow desired cooperation between an OEM or aftermath head unit and an external power amplifier. The inventive interface receives an audio input signal from the head unit. It also monitors the vehicle's CAN bus. The interface detects CAN bus commands that cause the head unit to play an audio notification signal such as a "chime." Upon detecting such a CAN bus command, the inventive interface selectively adjusts the output level so that the user hears the audio notification signal at an appropriate volume.

The inventive interface is preferably able to automatically detect the type of vehicle it has been installed into. The interface also includes programming functions so that an installer or end user can adjust its equalization and other features. The programming functions may also be used to manually set the identity of the vehicle.

BRIEF DESCRIPTIONS OF THE SEVERAL VIEWS OF THE DRAWINGS

REFERENCE NUMERALS IN THE DRAWINGS

Figure 1:
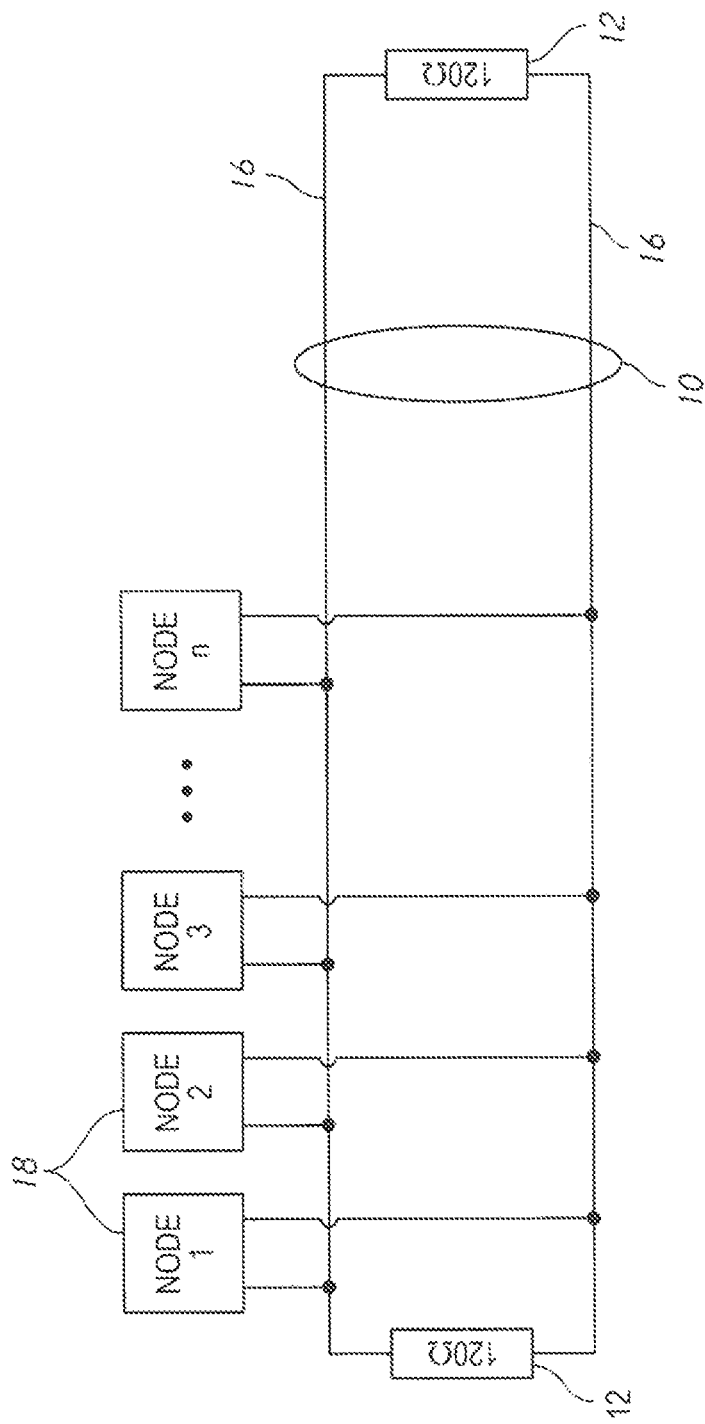
FIG. 1 is schematic view, showing the structure of prior art CAN bus.
Figure 2:
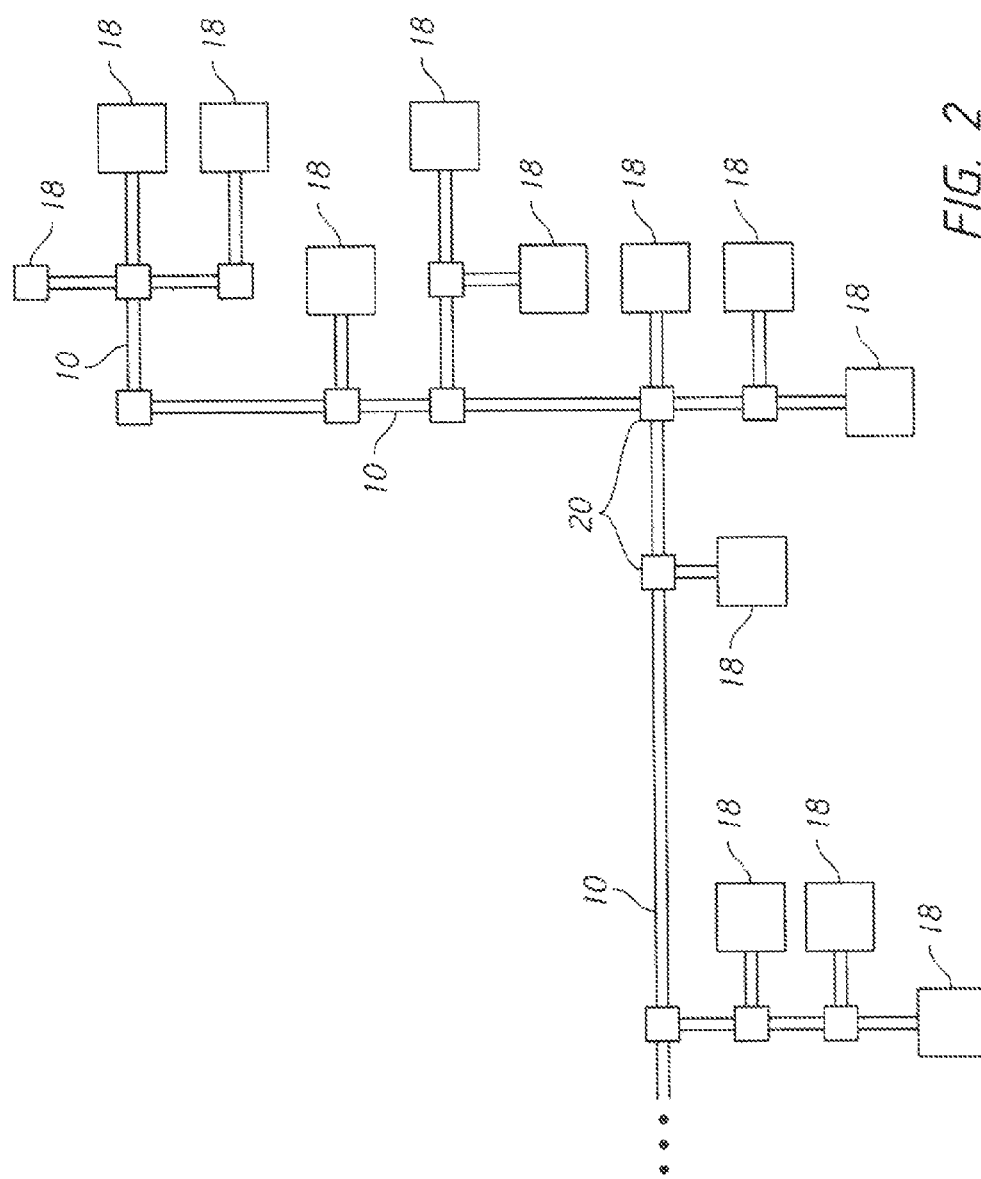
FIG. 2 is a schematic view, showing a branched structure for a CAN bus.
Figure 3:
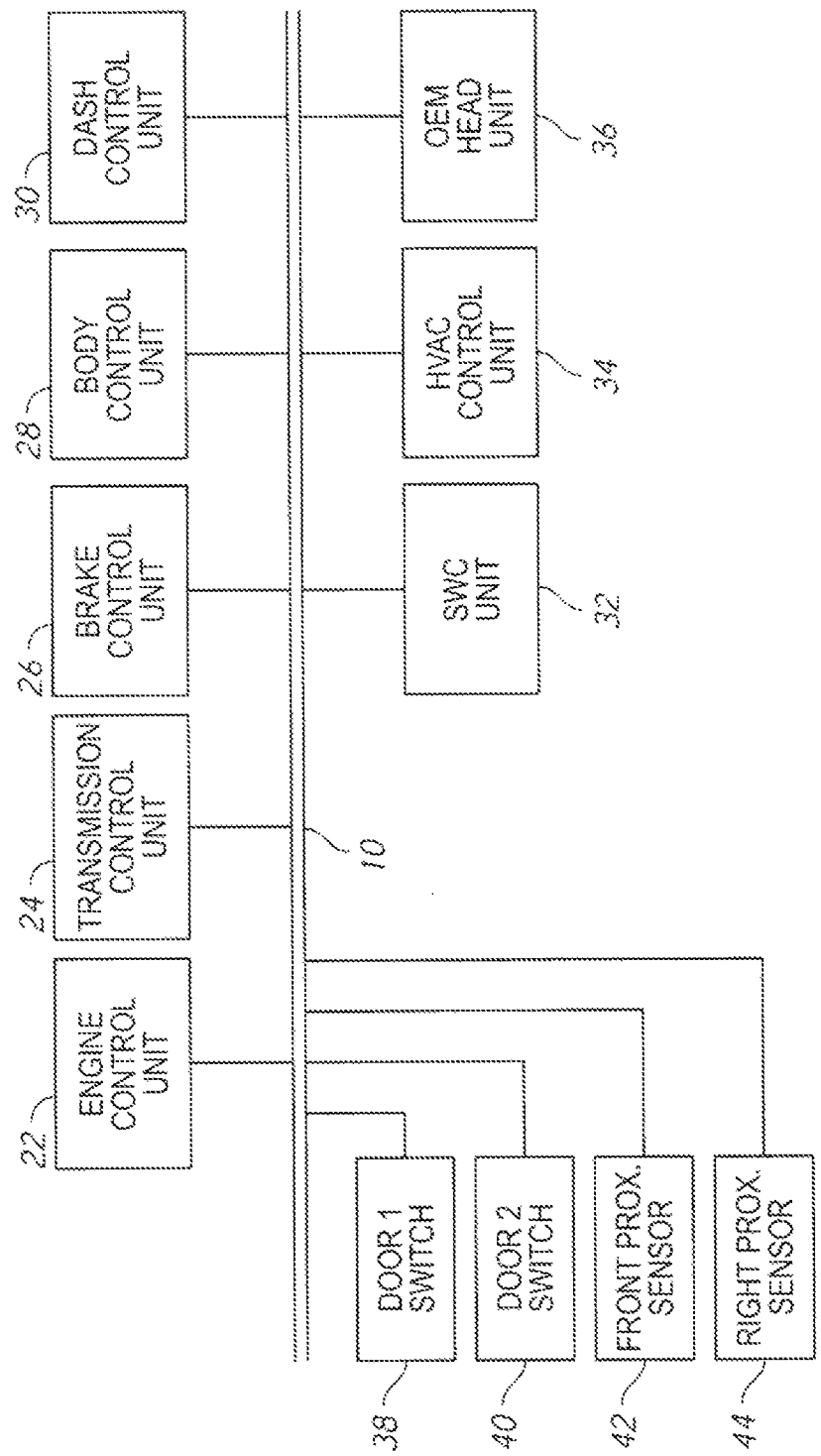
FIG. 3 is a schematic view, showing how various components may be connected to a CAN bus.
Figure 4:
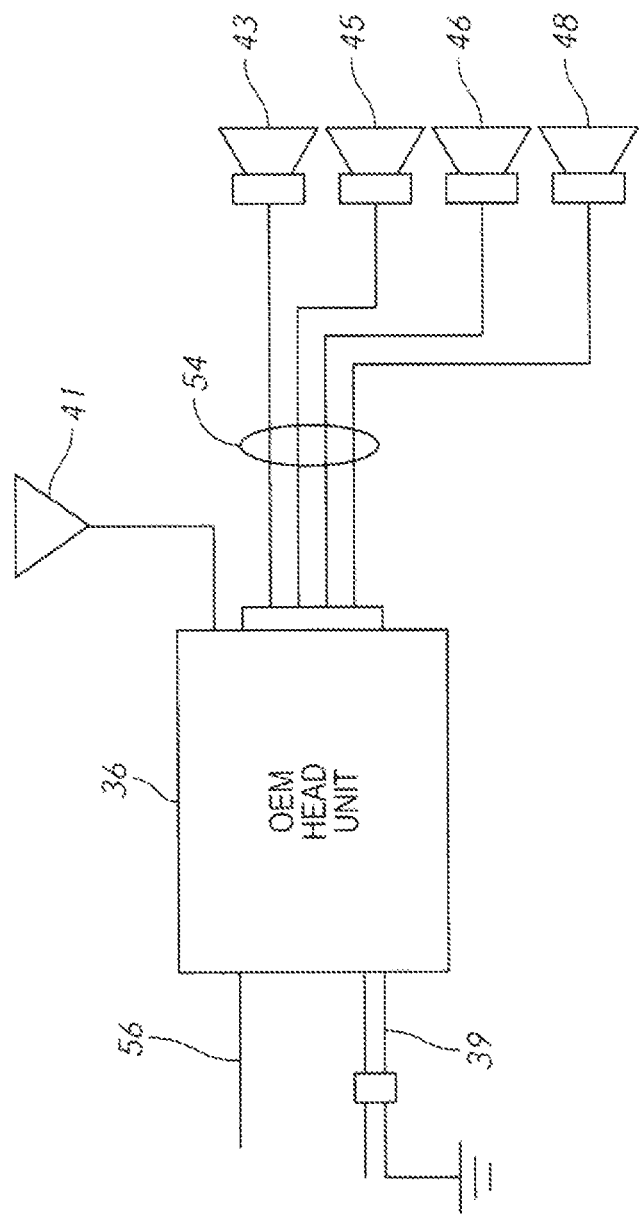
FIG. 4 is a schematic view, showing the connections typical in an OEM head unit.

10 CAN bus
12 terminator resistor
14 CAN HI conductor
16 CAN LO conductor
18 node 20 branch/connector
22 Engine Control Unit
24 Transmission Control Unit
26 Brake Control Unit
28 Body Control Unit
30 Dash Control Unit
32 SWC Unit
34 HVAC Control Unit
36 OEM Head Unit
38 Door 1 switch
39 power input
40 Door 2 switch
41 antenna input
42 front proximity sensor
43 right-front speaker
44 right proximity sensor
45 left-front speaker
46 right-rear speaker
48 left-rear speaker
50 subwoofer
52 line out controller feed
54 head unit output lines
56 CAN bus input
58 OEM amplifier
60 amplifier interface module
62 CAN bus input
interface output lines
66 signal conditioner
68 processor
70 memory
71 first equalizer
72 power supply
73 second equalizer
74 CAN port
75 third equalizer
76 Bluetooth port
77 fourth equalizer
78 fifth equalizer
79 USB port
80 sixth equalizer
82 control lines
84 aftermarket amplifier
83 analog to digital converter
85 signal line
86 D to A converter
87 input jacks
88 output jacks
90 USB jack
92 programming device
94 touchscreen display
96 back button
98 deeper menu button
100 slider
102 wireless link
104 interface head unit input
106 amplifier input
108 interface amplifier output

DETAILED DESCRIPTION OF THE INVENTION

Figure 6:
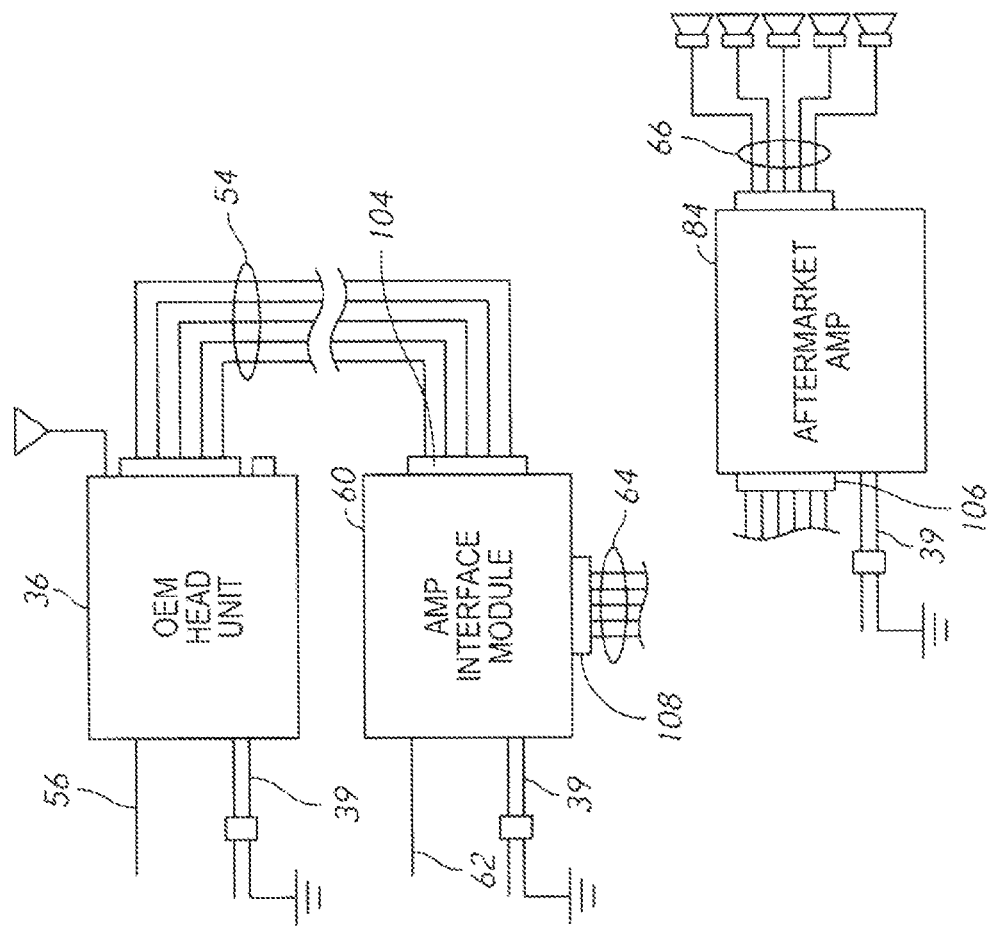
FIG. 6 is a schematic view, showing an exemplary installation for the present invention interface module.

FIG. 6 depicts an installation using the inventive amplifier interface module 60. OEM head unit 36 has multiple head unit output lines 54. The head unit output lines are typically conductor pairs configured to drive an individual speaker. Many vehicles have four such output lines (right-front, left-front, right-rear, and left-rear). Some have five such lines if a subwoofer is included. A few examples may have six output lines (where two subwoofers are included). The number of output lines does not necessarily correspond to the number of separate channels provided. For example, many stereo head units only support two channels (left and right). The right channel is fed to the right-front speaker and the right-rear speaker. The left channel is fed to the left-front speaker and the left-rear speaker. A fade control ("fader") is then used to adjust the relative gain between the front and rear speakers.

In the example of FIG. 6, OEM head unit 36 produces an input signal on six separate head unit output lines 54. Amplifier interface module 60 includes interface head unit input 104. In the preferred embodiment the interface head unit input is an array of several connectors, with each connector being configured to receive one of the head unit output lines (with two wires per output line).

Amplifier interface module 60 includes its own power input 39. It also includes its own CAN bus input 62. The amplifier interface module uses its CAN bus input to monitor the messages traveling on the CAN bus. The interface module outputs signals via interface amplifier output 108 (typically six separate conductor pairs). Interface amplifier is wired to amplifier input 106 on aftermarket amplifier 84. The aftermarket amplifier also has its own power input 39.

The aftermarket amplifier performs the conventional function of boosting the level of the incoming signal before feeding the boosted signal out to the various speakers over amplifier output lines 66. The reader will thereby perceive that amplifier interface module 60 lies between OEM head unit 36 (or a suitable aftermarket head unit) and aftermarket amplifier 84. It passes the signals from the head unit to the aftermarket amplifier. The amplifier interface module may also alter the signals, as will be explained.

Figure 7:
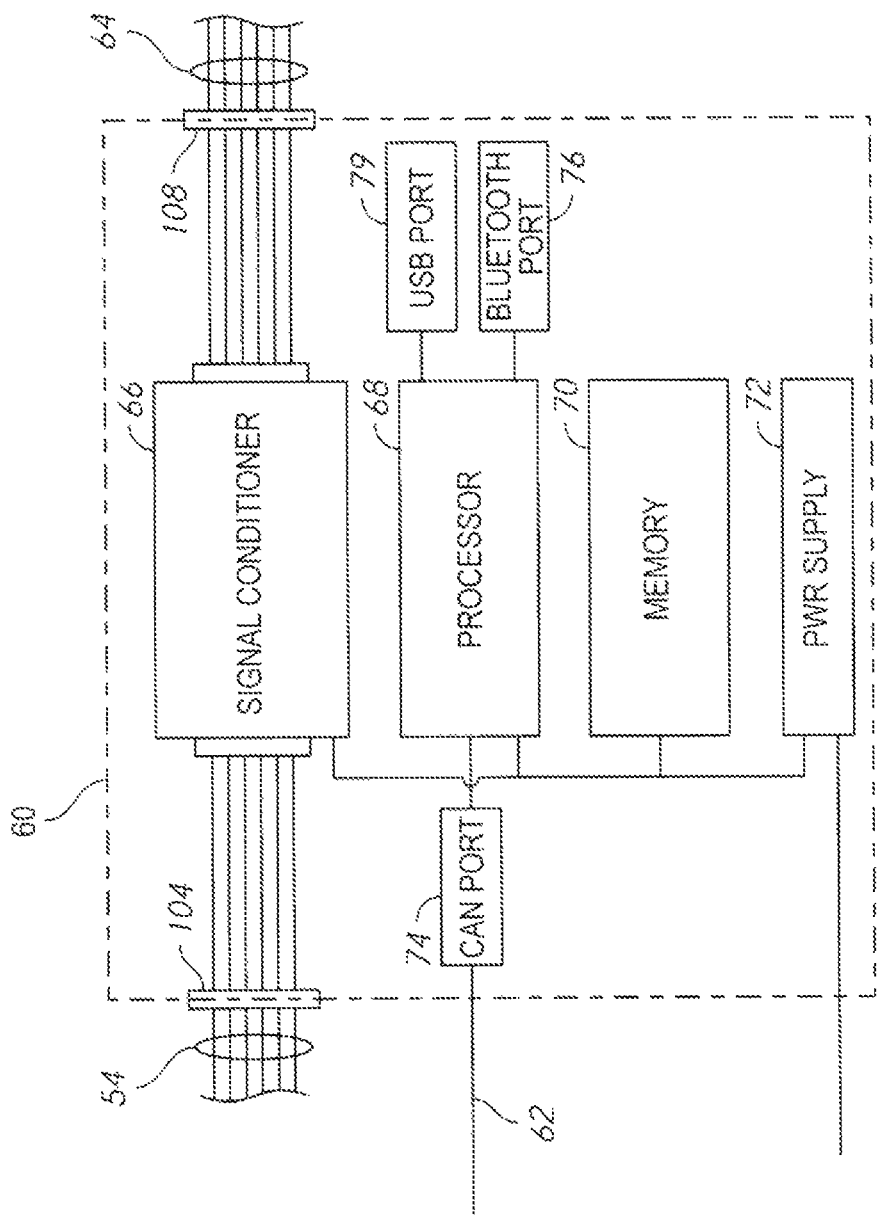
FIG. 7 is a schematic view, showing some internal details of the inventive interface module.

FIG. 7 depicts some exemplary internal details for the amplifier interface module. Those skilled in the art will know that the interface module could be constructed in many different ways, so the embodiment of FIG. 7 is properly viewed as only one example. In this example, head unit output lines 54 are fed in via interface head unit input 104. The signals are fed into signal conditioner 66. The output of signal conditioner 66 is fed to interface amplifier output 108 and then out to the aftermarket amplifier.

The amplifier interface module includes an internal processor 68 and an associated memory 70. Power supply 72 conditions the incoming power and supplies it to the various components. CAN port 74 is connected to CAN bus input 62. The CAN port may assume many forms. In the preferred embodiments it converts the difference signals on the two CAN conductors into binary signals and then into hexadecimal code that is fed to processor 68.

Processor 68 runs software that is typically retrieved from its associated memory 70. The memory also contains useful data such as "look-up tables" for the various CAN bus protocols that the amplifier interface module may encounter. Programming input to the processor is preferably provided via a wired input (such as USB port 79), a wireless input (such as BLUETOOTH port 76), or both.

Figure 8:
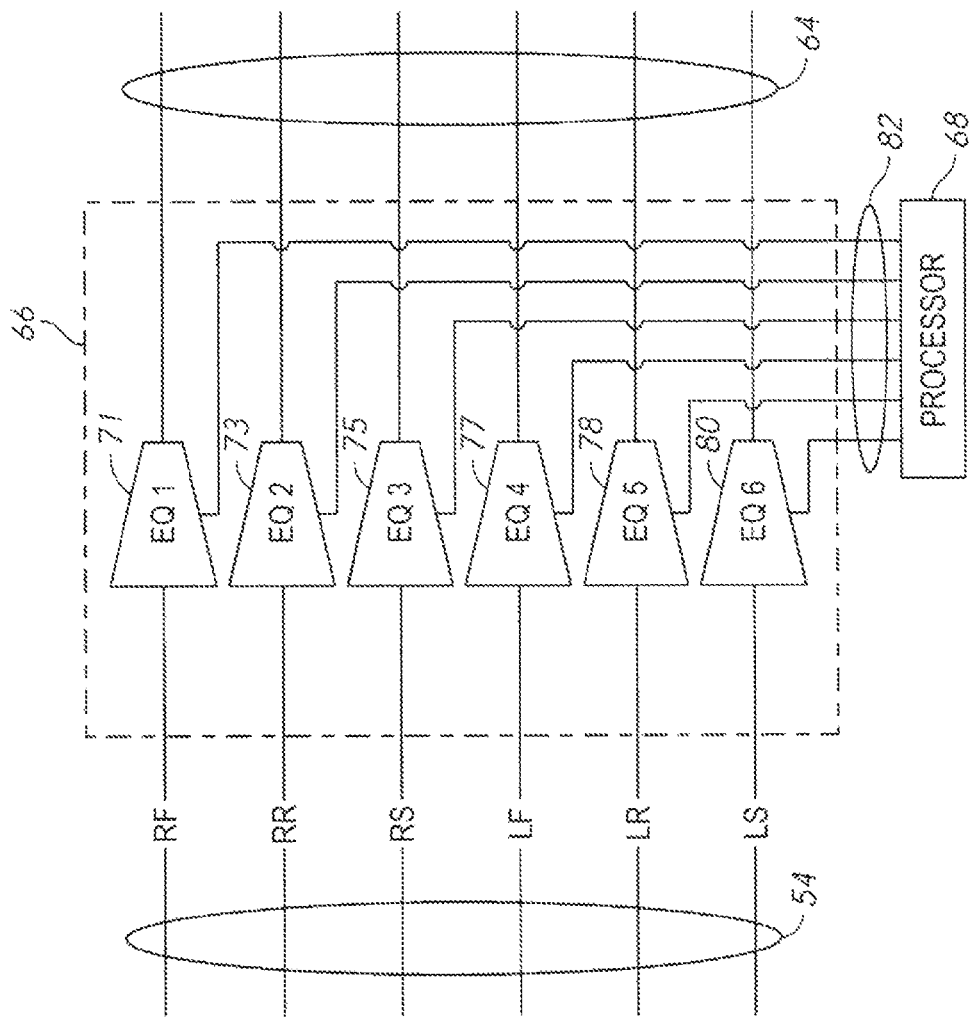
FIG. 8 is a schematic view, showing some internal details of the signal conditioner employed in the interface module.

FIG. 8 provides a detailed view of signal conditioner 66 and its functionality. In this embodiment, each of the six input channels feeds into an independently controlled equalizer. These are as follows:

RF (right-front) signal feeds into first equalizer 71.
RR (right-rear) signal feeds into second equalizer 73.
RS (right-subwoofer) signal feeds into third equalizer 75.
LF (left-front) signal feeds into fourth equalizer 77.
LR (left-rear) equalizer feeds into fifth equalizer 78.

LS (left-subwoofer) signal feeds into sixth equalizer 80.

The signals may originate as analog signals but then be transitioned into the digital domain for processing. After processing in the digital domain, the signals may then be transitioned to the analog domain. Alternatively, the signals may be processed entirely in the analog domain.

Whether in the digital or analog domain, each of the equalizers shown in FIG. 8 is preferably capable of boosting the signal gain, cutting the signal gain, and providing desired equalization functions. For example, if an OEM head unit puts out a signal where the lower portions of the frequency spectrum is given a lower gain, the equalizers may be set to restore a "flat" frequency distribution by boosting the lower frequencies. Further, if the OEM head unit is one that varies the "bass chop" depending on output level, the equalizations settings needed to counter this chop may be stored as a table or a mathematical function. Processor 68 may then analyze the overall input gain from the OEM head unit and apply the appropriate (variable) equalization settings to counter any bass chop. A test function may even be provided in a user interface to allow the testing and analysis of any bass chop performed by the OEM head unit.

Each of the equalizers is preferably controlled by processor 68 (via control lines 82). Each control line typically sends a digital signal setting an overall gain and a frequency distribution for each equalizer. Thus, the software running on processor 68 can be used to control the gain and frequency distribution on each of the lines.

Figure 9:
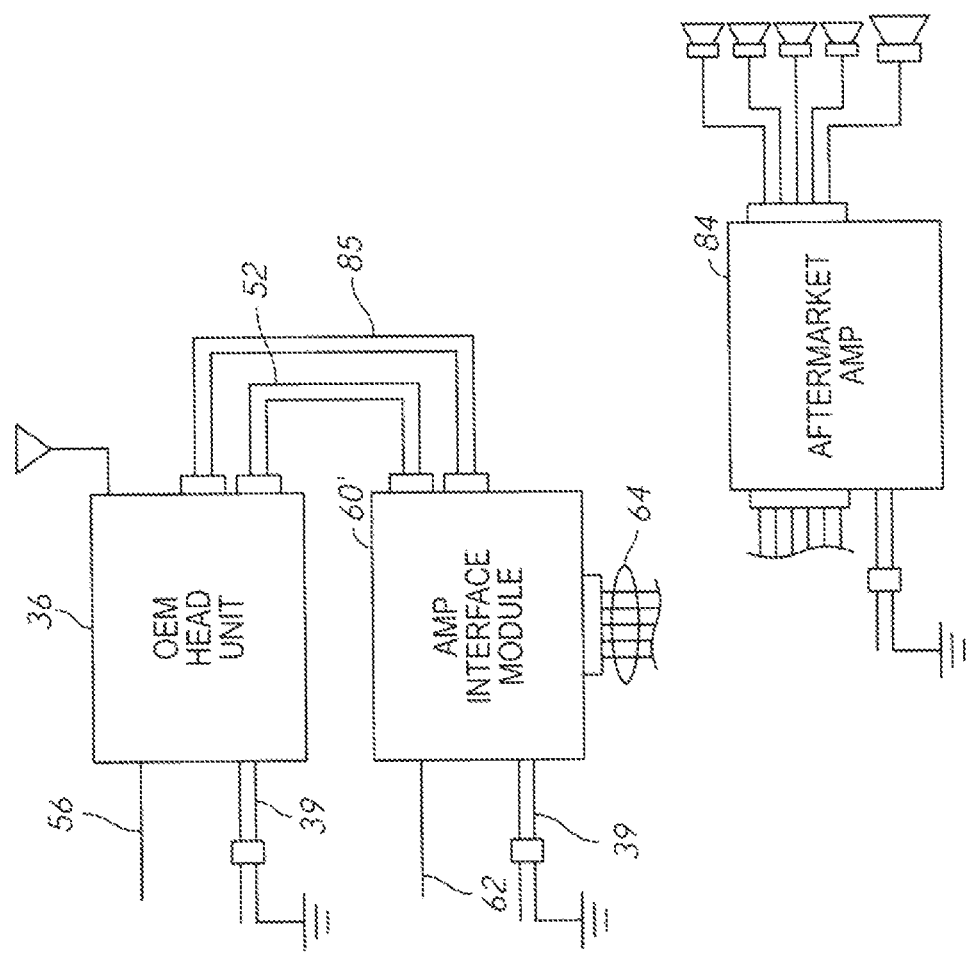
FIG. 9 is a schematic view, showing how the inventive interface module may be used with a digital signal line.
Figure 10:
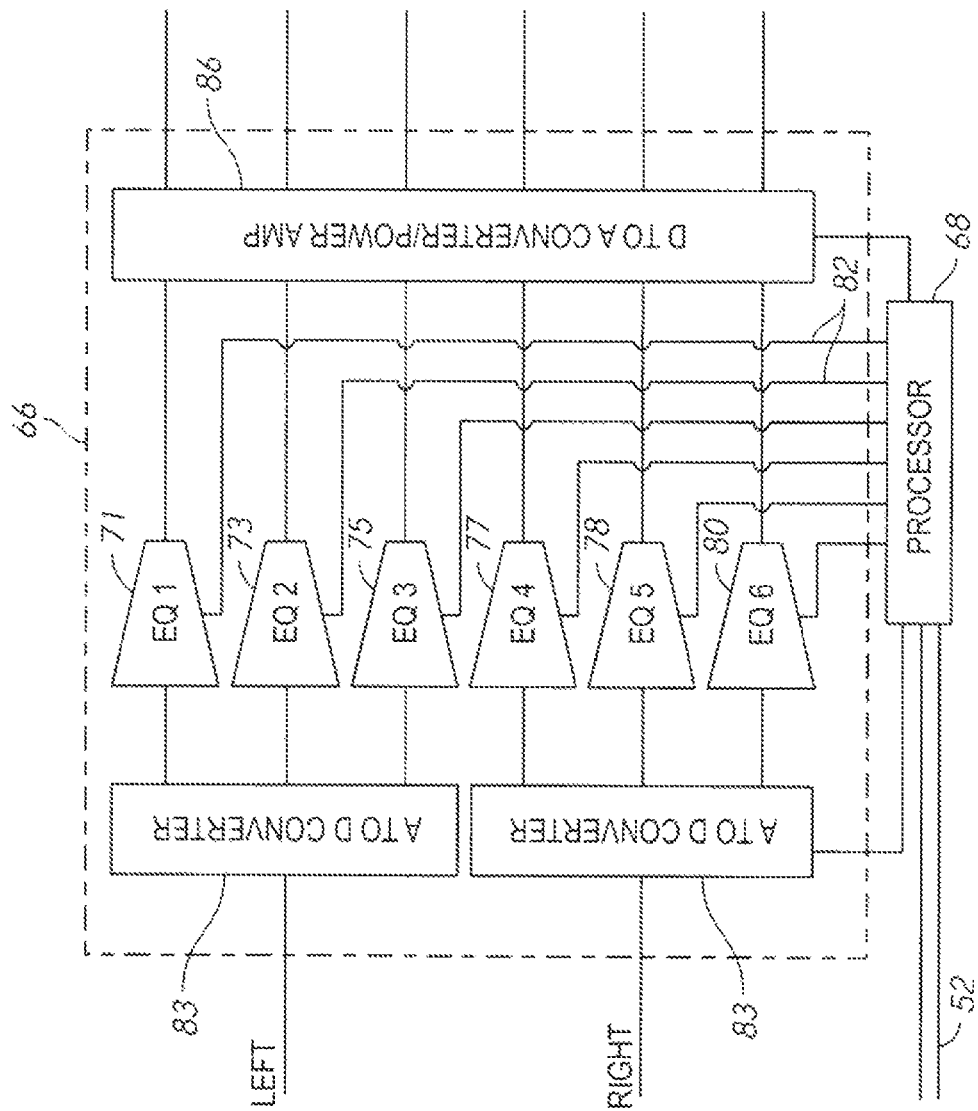
FIG. 10 is a schematic view, showing a version of the signal conditioner for use with a digital input.

FIGS. 9 and 10 show an alternate embodiment for use with a different type of heat unit. Some OEM head units are designed to use an external OEM amplifier that is digitally controlled. There are two types of signals fed to such digitally-controlled external amplifiers. In the first type the amplifier is fed an analog signal (a "left" signal on a pair of conductors and a "right" signal on another pair of conductors). Because the amplifier is digitally controlled—either by a dedicated digital signal line or via the CAN bus—this type is still referred to as a "digital" amplifier.

In the second type, the signal is truly a digital signal. A multiplexed signal is sent over an optical or electrical connection using a standard digital format. Exemplary formats include "Sony/Philips Digital Interface Format" ("S/PDIF") (Hyundai and Kia) and "MOST" (GM, BMW, Mercedes, and Volvo).

FIG. 9 shows an OEM head unit designed to transmit a signal to an external digital amplifier where the signal is transmitted in an analog format. Signal lines 85 carry the signals (which the reader will recall are actually analog signals). Line out controller signal 52 may be carried on a second conduit or may be carried on the CAN bus. Amplifier interface module 60' is configured to receive and process the incoming signals. It produces an analog audio signal that is suitable for use by an aftermarket amplifier. Thus, amplifier interface module 60' takes in signals through signal lines 85 and produces a multi-channel analog output signal on interface output lines 64 (which are connected to aftermarket amplifier 84).

FIG. 10 shows some possible internal details of signal conditioner 66 used in amplifier interface module 60'. Signal lines 85 are split into a first conductor pair carrying a stereo-left signal and a second conductor pair carrying a stereo-right signal. Each line carries the full frequency spectrum available from the head unit. In this example signal conditioner 66 is configured to produce six analog output channels (three right channels and three left channels). Further, the output channels are configured according to frequency distribution. For instance, the three "left" output channels may include a bass, mid range, and treble.

This result may be obtained in a variety of ways. In the example of FIG. 10, the stereo-left input and the stereo-right input are each fed into an analog-to-digital converter 83 with an appropriate sampling rate. The output of the A-to-D converter 83 for the left channels is split into three separate equalizers 71, 73, 75. The output of the A-to-D converter 83 for the right channel is likewise split into three separate equalizers 77, 78, 80. Each equalizer includes its own filtration and amplification parameters. Each equalizer is also controlled by processor 68. Processor 68 also receives line out controller feed 52 so that it can receive external instructions (typically from the head unit).

In response to signals on the line out controller feed (and adjustable user settings), the parameters controlling each equalizer are set. The result is that the six separate equalizers produce six separate outputs. Each output may be individually set as desired. These can be used to adjust equalization and "crossover" settings. As one example, the low-range equalizers (75 and 80 in this example) may be set to increase gain relative to the mid and high range equalizers in order to restore a "chopped bass" signal produced by an OEM head unit. The six lines coming out of the equalizers are then sent through digital-to-analog converter 86 in order to create an analog output signal. The D-to-A converter 86 may include a power amplifier to increase (or decrease) gain. Alternatively, such a power amplifier may be a separate component apart from the D-to-A converter.

A signal conditioner for use with true digital inputs (such as S/PDIF) may still require some signal manipulation before entering the equalizers. For example, some signal conditioning may be desirable to split the signal into separate channels carried on separate conductors. All these functions may be carried out within the signal conditioner. The inventive interface is preferably configured to work with all the current types of signal inputs—whether analog or digital. The true digital input provides a good example. A conventional external analog amplifier cannot be used with a head unit producing a true digital output (such as MOST or S/PDIF format). The inventive interface converts these digital signals into analog signals that a conventional external amplifier can then receive and process.

The inventive interface may also provide a true digital output (such as S/PDIF) that is intended for use with an external power amplifier configured to receive such an output. An embodiment of the invention may even be configured to take in analog signals from an OEM stereo and provide a digital output for use with an a aftermarket digital amplifier or other accessory.

Figure 5:
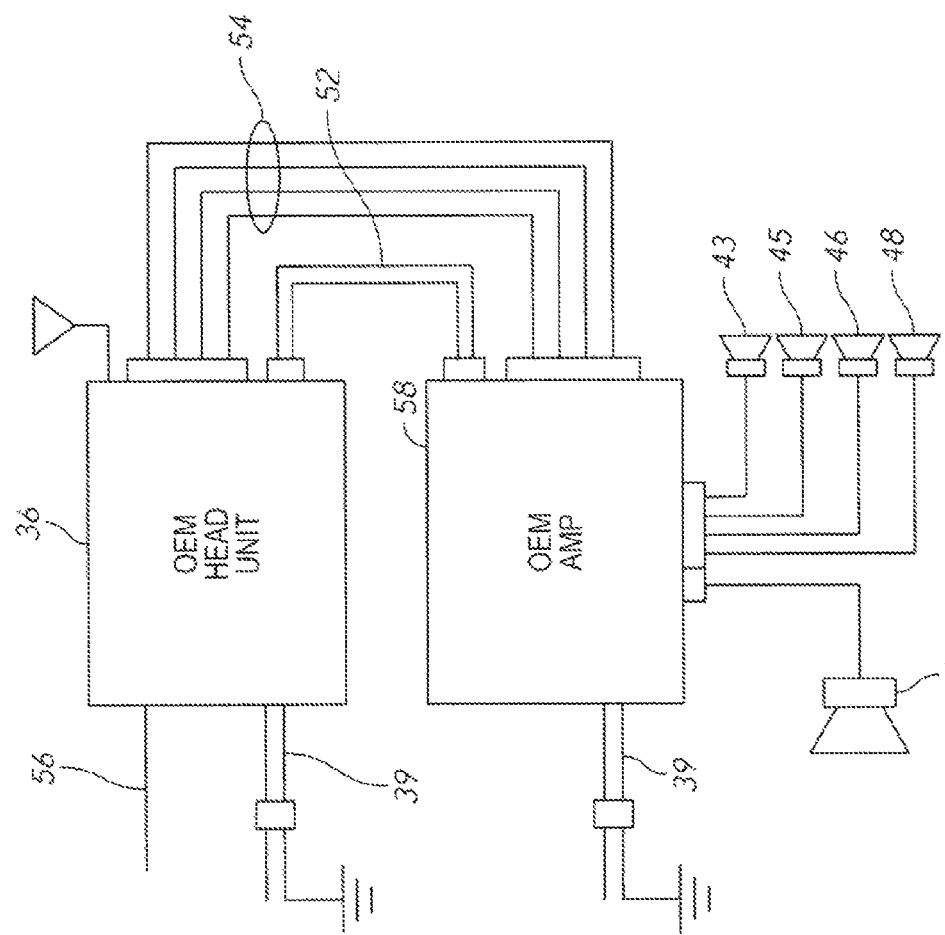
FIG. 5 is a schematic view, showing an alternative OEM head unit connected to an external amplifier.

Having thus described the structures used in the present invention, some of its operational details will now be explained. Returning to FIG. 5, the reader will recall that the inventive amplifier interface module 60 is placed between the output of the head unit and the input of an external amplifier. The interface module is also connected to the vehicle CAN bus, and this provides an opportunity for some self-configuration. Vehicle CAN buses operate according to established standards. For example, the "GMLAN" bus from General Motors operates at a speed of 33 kilobits per second. On the other hand, Chrysler's CAN bus transmits frames at 83.33 kb/s. Turning to FIG. 7, if the processor (via the CAN port) detects a 33 kilobit per second frame rate, then the control software running on the processor may be programmed to assume that the interface has been installed in a General Motors vehicle.

There are different versions under the GMLAN umbrella so the processor may need to do additional work. It can, for example, apply one or more of the possible protocols and then attempt to read incoming CAN bus messages. One of the protocols will produce a valid message stream and the processor will then "know" that is has identified the correct CAN protocol.

The specific vehicle information (make, model, etc.) may actually be queried and transmitted on the CAN bus. The processor can be programmed to look for and obtain this information so that it learns the specific vehicle. This information may even be detailed enough to provide the type of sound system installed. For example, the memory, associated with the processor might store the equalizer settings needed to correct the frequency distribution for a "low end" OEM sound system where the lower frequencies are chopped coming out of the head unit.

Once the proper CAN bus protocol is established, the amplifier interface module can read messages being exchanged on the vehicle CAN bus. Most of these messages will not be significant to the operation of the interface. However, audio notification signals (such as warning chimes) are significant and the interface is configured to react to the detection of these signals. Some examples will assist in explaining this operation.

If the amplifier interface module is installed in a 2010 Chevrolet Camaro, then the processor uses the GMLAN protocol applicable to that vehicle to monitor messages on the CAN bus. GM head units produce warning chimes for several purposes. For example, when a door is detected in an open state while the vehicle is in gear, the GM Body Control Unit creates a CAN message instructing the head unit to play a warning chime. That message decodes as:

10400040:86 3C FF FF 58

When the head unit receives this CAN bus message it will produce a particular warning chime at fixed intervals until it is instructed to stop. The "stop" instruction is also produced by the Body Control Unit. It decodes as:

10400040:86 3C 00 FF 58

Looking again at FIG. 6, the reader will note that amplifier interface module 60 receives these CAN bus messages at the same time as OEM head unit 36. The interface module in the preferred embodiments is programmed to reduce the gain on all signals it passes to the aftermarket amplifier immediately upon detecting the chime command. Further, the interface module is programmed to continue the reduced gain level until after the "chime stop" command is received and some additional interval has passed (such as 500 ms).

It is preferable to provide an appropriate reduced gain level in the interface's memory so that this level will be set irrespective of the current user-selected gain level. Continuing the 2010 Camaro example, the user might have set the audio system for a very high sound level. With the vehicle still in drive, the user then opens the driver side door in order to access an ATM or open a mailbox. Without the inventive interface module, the audio system would at this point produce an extremely loud warning chime. With the inventive interface module, the sound level automatically decreases and a warning chime at a moderate level is heard. After the user closes the door, the sound level returns to that previously selected by the user.

Another example concerns the use of audio notification signals for "parking assist" features. Chrysler vehicles produce a set of warning tones intended to indicate that the vehicle is getting closer to an obstacle. These messages and their corresponding tones decode as follows:

0xE5 to 0xE6 One beep when vehicle placed in reverse

0xE3 to 0xE4 Medium beep (approaching obstacle)

0xE0 to 0xE2 Fast beep (close to obstacle)

0xDF or less Continuous beep (collision imminent)

When the inventive interface is installed in a Chrysler vehicle, it "looks for" these signals on the CAN bus and attenuates the signal gain it passes through to the amplifier when they are present. The interface returns to the previously selected gain level when no more parking assist commands are detected for a specified interval.

From these explanations the user will understand that the audio notification signal may assume many different forms—even for a single vehicle. The amplifier interface module preferably stores all these possibilities in memory and monitors for their presence on the CAN bus. At any time such a signal is detected the gain attenuation feature is activated.

As explained previously, the inventive interface module preferably includes self-configuration features (such as automatically detecting the make and model of vehicle). However, it is also preferably to provide a programming interface so that an installer or user can alter the features. Such a programming interface preferably accommodates an existing external device such as a smartphone, iPad, or laptop.

Figure 11:
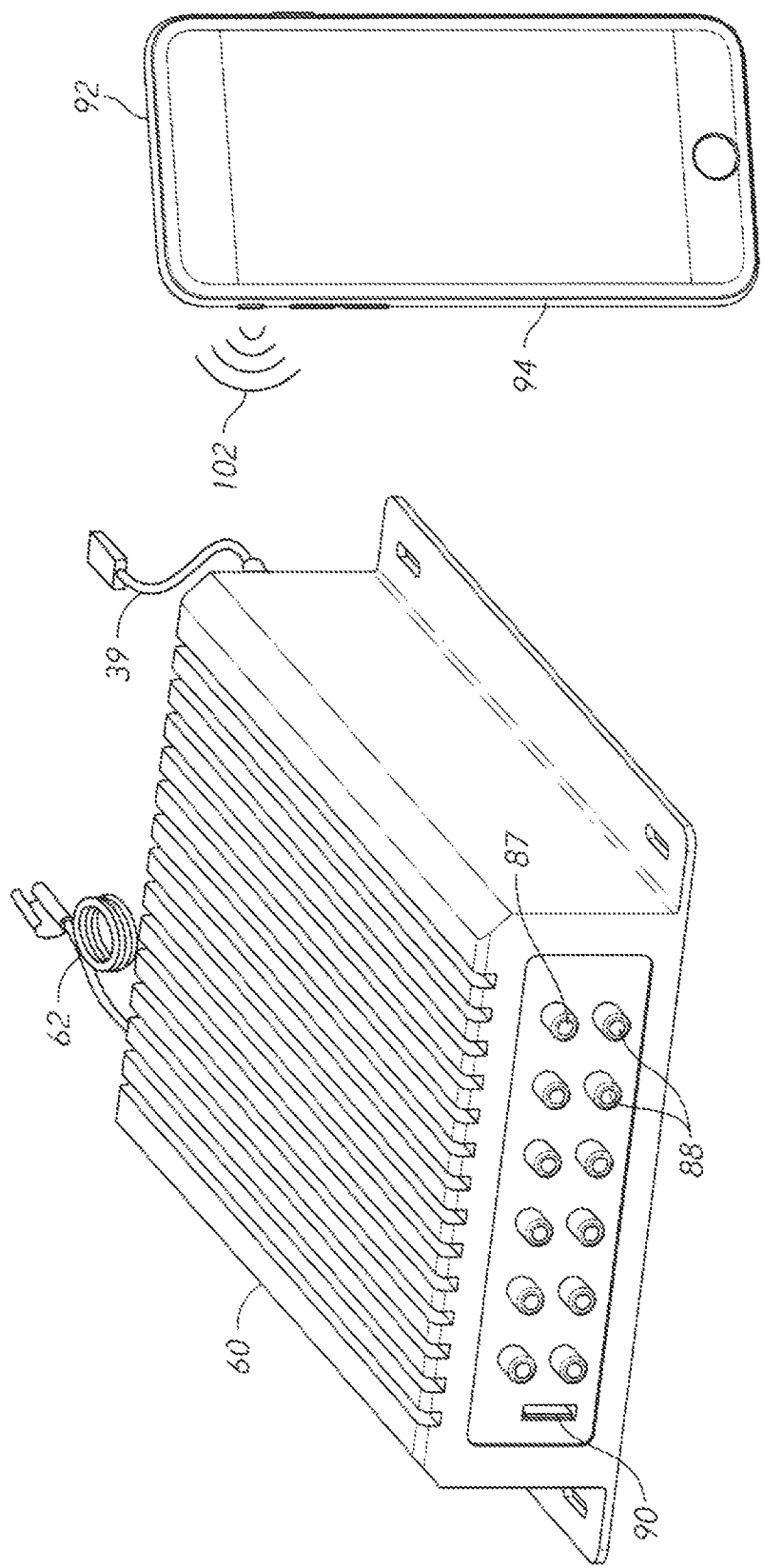
FIG. 11 is a perspective view, showing the inventive interface module and a programming device.

FIG. 11 shows one possible embodiment of the programming interface. Amplifier interface module 60 is provided as a standalone unit. It may be mounted behind the dash near the head unit. It may also be located near the aftermarket amplifier (such as in a trunk space). In the version shown, input jacks 87 are provided to receive the signals from the head unit. Output jacks 88 are provided to carry the signals out to the aftermarket amplifier. USB jack 90 allows an external programming device to be connected (such as a laptop computer). An internal wireless antenna is also provided for receiving signals via a BLUETOOTH interface or some other wireless interface. Power input 39 allows the interface module to be connected to vehicle power. CAN bus input 62 allows the interface module to be connected to the vehicle CAN bus.

In this version programming device 92 is a smartphone. The smartphone includes touchscreen display 94. Wireless link 102 carries programming signals to amplifier interface module 60 and receives signals from the interface module as well. As those skilled in the art will know, a smartphone can host and run an application designed to work with amplifier interface module 60. The features of this application can be displayed via touchscreen display 94 and the user can interact with the application using this touchscreen display.

A graphical user interface provided on the smartphone may assume an endless variety of forms. FIG. 12 shows one exemplary form. In FIG. 12(A) the user is provided with a menu for setting some of the graphic equalizer functions. A slider 100 is provided for the bass, mid, and treble ranges. The user may touch and move these sliders. These settings are wirelessly conveyed to the amplifier interface module. The processor in the interface module then adjusts the equalizers in signal conditioner 66. The user can make these adjustments while actually listening to the amplifier output.

Back button 96 is provided to return the user to a higher-level menu. Deeper menu button 98 allows the user to select a more detailed menu for controlling the graphic equalizer functions. The deeper menu could allow the user to control each individual equalizer within signal conditioner 66.

Figure 12B:
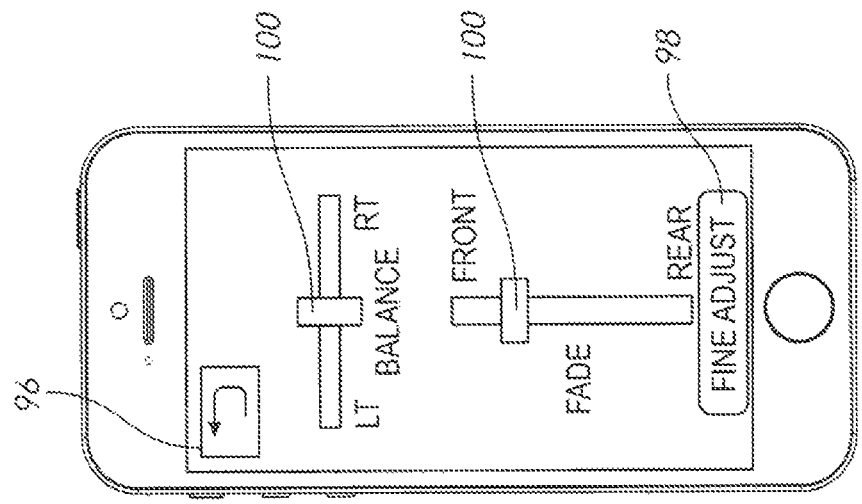
FIG. 12B is a plan view, showing a representative graphical user interface.
Figure 12A:
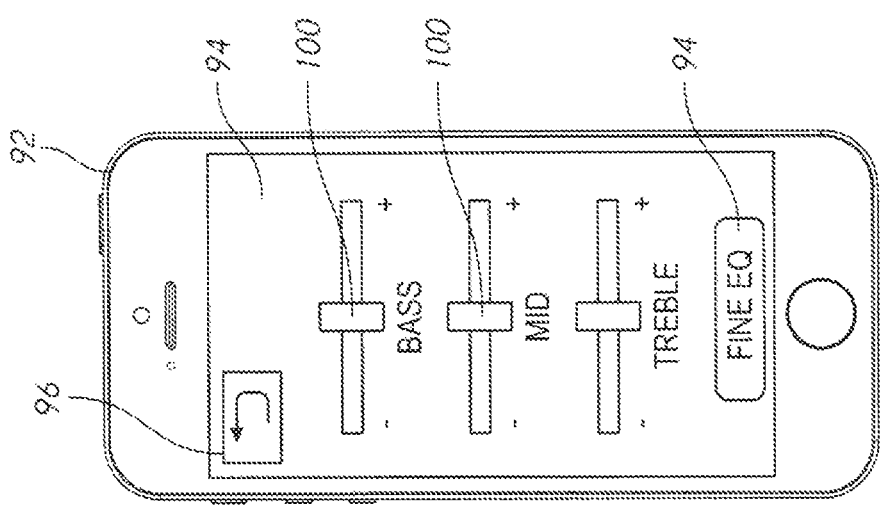
FIG. 12A is a plan view, showing a representative graphical user interface.

FIG. 12(B) provided a "balance and fade" menu. Sliders 100 are again provided so that the user can set the left-right balance and front-rear fade parameters as desired. Many other menu functions may be provided as well. For example, although the inventive interface preferably auto-detects the vehicle type, the GUI menu might allow the user or installer to simply select the make, model, and year of the vehicle. Alternatively, the interface might present the user with the auto-detected information and simply ask the user to confirm the accuracy of this information.

The provision of a simple front/rear fade setting suitable for some installations, but the inventive interface module can provide more sophisticated control of the individual speaker outputs. For example, a variable delay may be added for each individual output. Many installations will include six speakers in six different locations. A driver may wish to adjust the delay to optimize the perception of sound at the driver's location. Each of the six speakers is a different distance from the driver's ears. The best result is thought (by many users) to occur when the sound from all the speakers reaches the ear of the listener at the same instant. In order to achieve this goal, the nearest speaker must be delayed long enough to match the farthest speaker.

The user interface may be given delay settings that allow this optimization. The interface may even incorporate some application software for measuring and adjusting the delay. If the interface is running on a smartphone, the smartphone's microphone can be used to sample speaker outputs. A test signal could be issued by the interface module (at the command of the interface on the smart phone) and the microphone could be used to record the arrival time from the different speakers. The application could then automatically adjust the delay applied to the output channels of the inventive interface.

Additional possible features of the inventive amplifier interface module include:

1. The ability receive 6 input channels, all at a 48 kHz sampling rate.

2. The ability to output 6 channels. The input channels may start as an analog signal that is then processed in the digital domain before being returned to the analog domain, or all the processing may be done in the analog domain.

3. Each of the output channels may be driven by a scaled mix of the input channels.

4. Four or more of the output channels may be controlled by independent 15-band graphic equalizers. 31-band equalizers may also be used.

5. Subwoofer output channels may be controlled by 7-band graphic equalizers.

6. Each output channel may include a delay of 10 ms or longer, in order to ensure that the attenuation feature is implemented in time.

7. The subwoofer output channel(s) may include an independent channel gain.

8. Channel gain values and filter coefficients may be independently calculable and loaded via the external programming interface.

9. In some configurations the inventive interface may simply cease all audio feed from the head unit and play an internally-generated audio notification signal (warning chime). The interface will then resume the audio feed when the warning chime command ceases.

10. The inventive interface can include an amplifier "turn on output" for controlling the external aftermarket amplifier.

11. The inventive interface may adjust volume dynamically when emulating an OEM digital amplifier.

Although the preceding description contains significant detail, it should not be construed as limiting the scope of the invention but rather as providing illustrations of the preferred embodiments of the invention. Thus, the language used in the claims shall define the invention rather than the specific embodiments provided.

Having described our invention, we claim:

1. An amplifier interface module for connecting a stereo head unit and an external amplifier in a vehicle including a CAN bus, wherein said stereo head unit receives CAN bus signals over said CAN bus and produces signals on head unit output lines, and wherein said external amplifier includes an amplifier input, comprising:
   a. a CAN bus input configured to connect to said CAN bus;
   b. a processor running software, said processor having an associated memory;
   c. an interface head unit input;
   d. an interface amplifier output;
   e. said interface head unit input being configured to connect to said head unit output lines;
   f. said interface amplifier output being configured to connect to said amplifier input;
   g. said amplifier interface module being configured to monitor said CAN bus input in order to detect an audio notification signal on said CAN bus; and
   h. said amplifier interface module being configured to, upon detection of said audio notification signal, adjust a signal gain on said interface amplifier output.

2. An amplifier interface module as recited in claim 1, wherein said memory stores CAN bus protocols for multiple different vehicle makes.

3. An amplifier interface module as recited in claim 2, wherein said processor is configured to automatically detect a vehicle make by analyzing messages on said CAN bus.

4. An amplifier interface module as recited in claim 1, further comprising a programming interface allowing a user to alter functions carried out by said processor.

5. An amplifier interface module as recited in claim 1, further comprising:
   a. a signal conditioner controlled by said processer; and
   b. said signal conditioner being configured to perform equalization functions on said interface amplifier output.

6. An amplifier interface module as recited in claim 5, wherein:
   a. said interface amplifier output includes five separate channels; and
   b. said equalization functions are configured to be independently adjustable for each of said five separate channels.

7. An amplifier interface module as recited in claim 4, wherein said programming interface comprises:
   a. an adjustable left-right balance setting;
   b. an adjustable fade setting; and
   c. adjustable equalization settings.

8. An amplifier interface module as recited in claim 4, wherein said programming interface comprises a USB port.

9. An amplifier interface module as recited in claim 4, wherein said programming interface comprises a wireless connection.

10. An amplifier interface module as recited in claim 9, wherein said programming interface comprises an external programming device with a graphical user interface.

11. An amplifier interface module for connecting a stereo head unit and an external amplifier in a vehicle including a CAN bus, wherein said stereo head unit receives CAN bus signals over said CAN bus and produces signals on head unit output lines, and wherein said external amplifier includes an amplifier input, comprising:

a. a CAN bus input configured to connect to said CAN bus;
b. a processor running software, said processor having an associated memory;
c. an interface head unit input;
d. an interface amplifier output;
e. said interface head unit input being configured to connect to said head unit output lines;
f. said interface amplifier output being configured to connect to said amplifier input;
g. said amplifier interface module being configured to monitor said CAN bus input in order to detect an audio notification signal on said CAN bus;
h. said amplifier interface module being configured to place a first signal gain on said interface amplifier output; and
1. said amplifier interface module being configure to, upon detection of said audio notification signal, reduce said first signal gain on said interface amplifier output to a second lower signal gain for a period of time and then return to said first signal gain.

12. An amplifier interface module as recited in claim 11, wherein said memory stores CAN bus protocols for multiple different vehicle makes.

13. An amplifier interface module as recited in claim 12, wherein said processor is configured to automatically detect a vehicle make by analyzing messages on said CAN bus.

14. An amplifier interface module as recited in claim 11, further comprising a programming interface allowing a user to alter functions carried out by said processor.

15. An amplifier interface module as recited in claim 11, further comprising:
a. a signal conditioner controlled by said processor; and
b. said signal conditioner being configured to perform equalization functions on said interface amplifier output.

16. An amplifier interface module as recited in claim 15, wherein:
a. said interface amplifier output includes five separate channels; and
b. said equalization functions are configured to be independently adjustable for each of said five separate channels.

17. An amplifier interface module as recited in claim 14, wherein said programming interface comprises:
a. an adjustable left-right balance setting;
b. an adjustable fade setting; and
c. adjustable equalization settings.

18. An amplifier interface module as recited in claim 14, wherein said programming interface comprises a USB port.

19. An amplifier interface module as recited in claim 14, wherein said programming interface comprises a wireless connection.

20. An amplifier interface module as recited in claim 19, wherein said programming interface comprises an external programming device with a graphical user interface.

* * * * *